(12) United States Patent
Bolken et al.

(10) Patent No.: US 6,906,403 B2
(45) Date of Patent: Jun. 14, 2005

(54) SEALED ELECTRONIC DEVICE PACKAGES WITH TRANSPARENT COVERINGS

(75) Inventors: Todd O. Bolken, Star, ID (US); Chad A. Cobbley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/164,077

(22) Filed: Jun. 4, 2002

(65) Prior Publication Data

US 2003/0222333 A1 Dec. 4, 2003

(51) Int. Cl.$^7$ ............................................. H01L 23/02
(52) U.S. Cl. ..................... 257/678; 257/680; 257/704; 257/777; 257/787; 257/794
(58) Field of Search ................ 257/678, 680, 257/704, 777, 787, 794, 703

(56) References Cited

U.S. PATENT DOCUMENTS

| | | | | |
|---|---|---|---|---|
| 5,068,713 A | * | 11/1991 | Toda | 357/72 |
| 5,264,393 A | * | 11/1993 | Tamura et al. | 437/209 |
| 5,458,716 A | | 10/1995 | Alfaro et al. | |
| 5,773,323 A | * | 6/1998 | Hur | 438/123 |
| 5,811,799 A | * | 9/1998 | Wu | 250/239 |
| 5,865,935 A | * | 2/1999 | Ozimek et al. | 156/303.1 |
| 5,958,100 A | * | 9/1999 | Farnworth et al. | 65/47 |
| 6,028,351 A | * | 2/2000 | Klonis et al. | 257/680 |
| 6,028,773 A | | 2/2000 | Hundt | |
| 6,037,655 A | * | 3/2000 | Philbrick et al. | 257/680 |
| 6,072,232 A | * | 6/2000 | Li et al. | 257/680 |
| 6,117,193 A | | 9/2000 | Glenn | |
| 6,130,448 A | * | 10/2000 | Bauer et al. | 257/222 |
| 6,147,389 A | * | 11/2000 | Stern et al. | 257/434 |
| 6,266,197 B1 | * | 7/2001 | Glenn et al. | 359/819 |
| 6,285,064 B1 | * | 9/2001 | Foster | 257/433 |
| 6,297,540 B1 | * | 10/2001 | Assadi et al. | 257/432 |
| 6,414,384 B1 | * | 7/2002 | Lo et al. | 257/685 |
| 6,614,103 B1 | | 9/2003 | Durocher et al. | |
| 2002/0066966 A1 | * | 6/2002 | Farnworth | 257/787 |
| 2002/0089025 A1 | * | 7/2002 | Chou | 257/433 |
| 2002/0096730 A1 | * | 7/2002 | Tu et al. | 257/433 |
| 2002/0149312 A1 | * | 10/2002 | Roberts et al. | 313/495 |
| 2002/0190397 A1 | * | 12/2002 | Kim | 257/796 |
| 2003/0071340 A1 | * | 4/2003 | Derderian | 257/686 |
| 2004/0038442 A1 | | 2/2004 | Kinsman | |

OTHER PUBLICATIONS

Merriam–Webster Collegiate Dictionary, Tenth Edition, p. 747.*

* cited by examiner

*Primary Examiner*—Mary Wilczewski
*Assistant Examiner*—Monica Lewis
(74) *Attorney, Agent, or Firm*—TraskBritt

(57) ABSTRACT

The invention provides improved packaging for electronic devices that are light or other radiation-sensitive, such as image sensors including CCD or CMOS chips. Methods of assembly are also provided. In one embodiment of the invention, an image sensor package is assembled by surrounding a chip with a barrier of transfer mold compound and covering the chip with a transparent lid. In another embodiment of the invention, the perimeter area of a chip, including interconnections such as wire bonds and bond pads, is encapsulated with a liquid dispensed epoxy, and a transparent lid is attached. In yet another embodiment of the invention, chip encapsulation is accomplished with a unitary shell of entirely transparent material. In yet another embodiment of the invention, a substrate-mounted chip and a transparent lid are loaded into a transfer mold that holds them in optimal alignment. The transfer mold is then filled with molding compound to encapsulate the chip and interconnections, and to retain the transparent lid.

8 Claims, 8 Drawing Sheets

SEALED ELECTRONIC DEVICE PACKAGES WITH TRANSPARENT COVERINGS

BACKGROUND OF THE INVENTION

1. Field of the Invention

The present invention relates generally to electronic devices that are sensitive to light or other forms of radiation. More particularly, the present invention relates to packages with transparent coverings for enclosing image sensors and methods for their assembly.

2. State of the Art

Solid-state image sensors, for example, charge coupled devices (CCDs) or complementary metal-oxide semiconductor (CMOS) chips, are increasingly in demand for use with electronic devices such as digital cameras. Conventionally, these sensors have been packaged for use by mounting them to a substrate and enclosing them within a housing assembly. The housing assembly incorporates a transparent lid to allow light or other forms of radiation to be received by the sensor. The lid may be a flat window or shaped as a lens to provide optical properties. The substrate and housing are often formed from a ceramic material, and the lid is glass or a similar transparent substance attached to the housing by an adhesive. Due to the materials and structure involved, this packaging technique may be expensive and difficult to manufacture. Further, growing desire for portable electronic devices that will stand up to extreme environments raises concerns of durability and size.

In order to better meet large-scale production requirements, various methods have been developed in attempts to simplify the construction of image sensors. Examples include U.S. Pat. No. 6,266,197 to Glenn et al., which discloses fabricating multiple sensor housings at one time by molding window arrays. U.S. Pat. No. 6,072,232 to Li et al. discloses a plastic package with an embedded frame for reducing material costs. U.S. Pat. No. 5,811,799 to Wu discloses a simplified substrate that is a printed wiring frame with a wall erected thereon. While these and other designs have been of some benefit, they still involve a number of specialized parts requiring multiple, sometimes precision, steps for assembly. Issues concerning material costs and part complexity remain.

Accordingly, a need exists for improved image sensor packaging that is simple to assemble and cost effective, while being of durable and light construction.

BRIEF SUMMARY OF THE INVENTION

In accordance with the present invention, improved packages for image sensors and methods for their assembly are disclosed. Embodiments of the present invention are directed to image sensor chips or similar light or other radiation-sensitive electronic components mounted on a carrier substrate. The chips are mounted to the carrier substrate in a conventional manner with epoxy or a tape lamination process and electrically connected to substrate conductive elements with wire bonds or other suitable interconnections. The chips are enclosed within a protective barrier including a transparent covering which acts as a window or lens. If desired, an array of chips may be mounted on a single large substrate and the substrate later sectioned to form individual image sensor packages. Once assembled, the image sensor packages may be incorporated into electronic devices by attachment with electrical connections on the carrier substrate. The materials used are inexpensive while providing durable, lightweight and simple construction.

In one exemplary embodiment of the invention, an image sensor package is assembled by surrounding a chip with a barrier of transfer mold compound such that the chip and its interconnections are left exposed. This exposed area coincides with the outer perimeter of a transparent lid. An adhesive of a known, suitable type is applied to the perimeter of the lid, which is then positioned at an optimum distance from the chip within the exposed area. If the adhesive requires curing, the adhesive may be activated to secure the lid to the barrier of mold compound.

In another exemplary embodiment of the invention, the perimeter area of a chip, including interconnections such as wire bonds and bond pads, is encapsulated with a liquid dispensed epoxy or other liquid dispensed nonconductive material. A transparent lid placed on top of the chip is retained by adhesion with the epoxy that encapsulates the chip perimeter. The lid may be placed directly on the chip, or a gasket may be used, if necessary, to prevent epoxy from seeping into the area beneath the lid due to capillary action. Once the lid is attached, the assembly may be further encapsulated by a transfer mold compound or a pot mold compound for increased protection if desired.

In yet another exemplary embodiment of the invention, chip encapsulation is accomplished with a unitary shell of entirely transparent material. The shell may be formed by molding a transparent compound directly around the chip or by attaching a preformed shell to the carrier substrate with an adhesive. The clearness or transmissivity of the shell surface may be improved by using a very smooth mold surface or by polishing the shell after it is molded.

In yet another exemplary embodiment of the invention, a substrate-mounted chip and a transparent lid are loaded into a mold tooling element, such as a transfer mold configured to hold them in optimal alignment. The transfer mold is then filled with molding compound to encapsulate the chip and interconnections, and to secure the transparent lid in place. A conformal film may be disposed between the surface of the mold cavity and the transparent lid to act as a gasket for controlling mold compound flash on the surface of the transparent lid.

As a further variation, any of the above-described exemplary package embodiments may be used with one or more electronic components of a stacked multi-chip module (MCM). The chips are mounted to a carrier substrate and to each other in a conventional manner with epoxy or a tape lamination process. The chips are electrically interconnected to each other and to the substrate conductive elements with wire bonds or other suitable interconnections.

Other and further features and advantages will be apparent from the following descriptions of the various embodiments of the present invention when read in conjunction with the accompanying drawings. It will be understood by one of ordinary skill in the art that the following are provided for illustrative and exemplary purposes only, and that numerous combinations of the elements of the various embodiments of the present invention are possible.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1A:
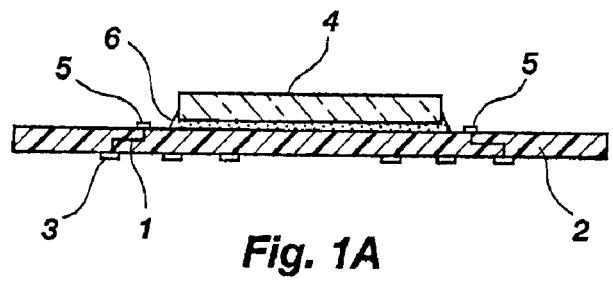
FIGS. 1A–1E are schematic sectional side views showing an exemplary method of formation of an image sensor package, wherein encapsulation includes surrounding a chip with a barrier of transfer mold compound and attaching a transparent lid to the barrier with adhesive applied to the perimeter of the lid.
Figure 1B:
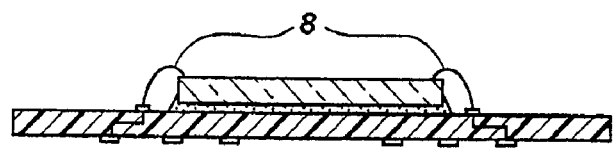
Figure 1C:
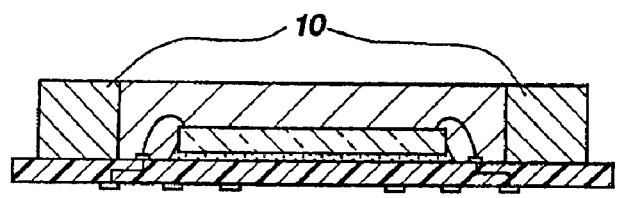
Figure 1D:
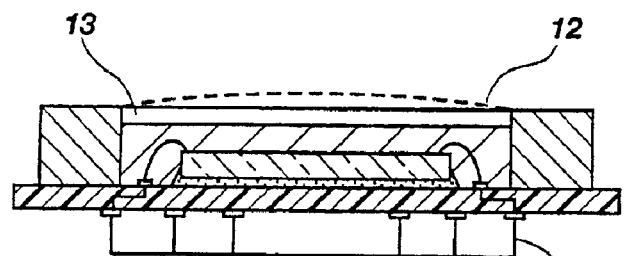
Figure 1E:
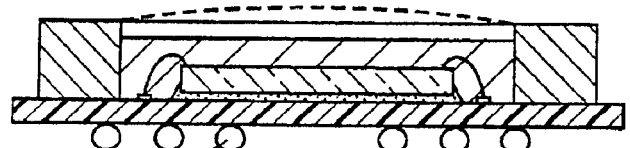
Figure 2A:
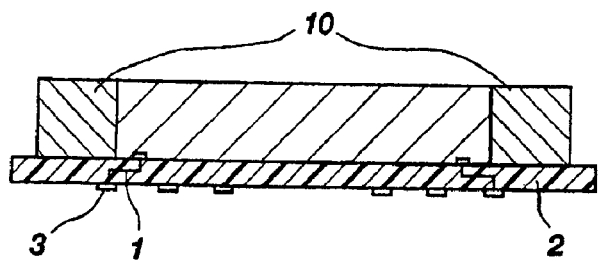
FIGS. 2A–2E are schematic sectional side views showing an example of forming an image sensor package using the same method as in FIGS. 1A–1E, except that the barrier of transfer mold compound is formed on the carrier substrate prior to mounting the chip.
Figure 2B:
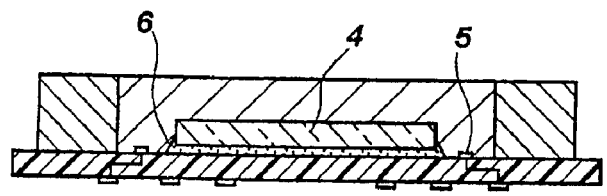
Figure 2C:
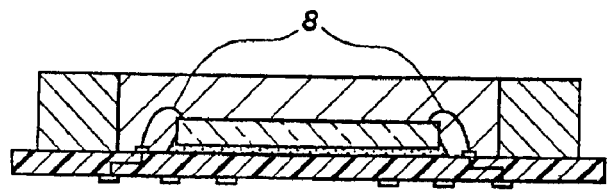
Figure 2D:
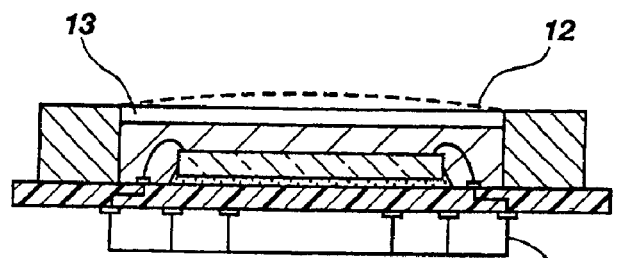
Figure 2E:
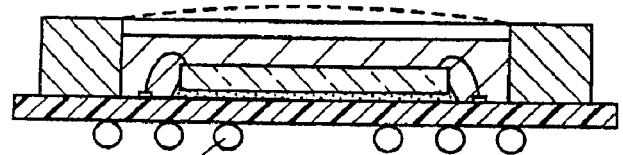

Generally, the present invention includes methods for assembling packaged image sensors that include solid-state devices, such as CCD or CMOS chips, to receive an image of reflected light or other electromagnetic radiation from one or more objects. It should be understood, however, that the packages and other methods of the present invention would also work well for enclosing other types of light or other radiation-sensitive electronic components such as, for instance, erasable programmable read-only memory chips (EPROMs).

Referring to the accompanying drawings, wherein similar features and elements are identified by the same or similar reference numerals, the various embodiments of the image sensor packages are formed on a carrier substrate 2. Carrier substrate 2 includes conductive elements 1 (e.g., traces) having first ends with terminal pads 5 for electrical connection with components, such as a chip 4, on carrier substrate 2. Wire bonds 8 are shown as the intermediate conductive elements that electrically connect bond pads 5' of chip 4 and corresponding terminal pads 5 on the upper surface of carrier substrate 2, but other suitable interconnections, including flip-chip or conductive tape-automated bonding (TAB) elements carried by a dielectric, polymeric film, may be used when compatible with the structures of chip 4 and carrier substrate 2. The second ends of the conductive elements 1 terminate in attachment pads 3 for connecting carrier substrate 2 to the surface of a larger assembly, such as a printed circuit board. Carrier substrate 2 may be constructed of plastic, such as thermoplastic and thermosetting plastics, which is less expensive and lighter than the ceramic substrates typically used for image sensors. Other common substrate materials such as FR-4 or BT would be suitable as well.

Figure 3:
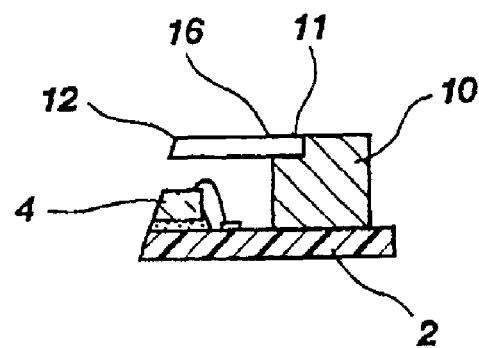
FIG. 3 is an alternative partial schematic sectional side view of the image sensor package formed by the methods of FIGS. 1A–1E or FIGS. 2A–2E, wherein a ledge is formed on the inner perimeter of the molded barrier to support the transparent lid.

Turning to FIGS. 1A through 3, a first embodiment of the present invention is illustrated. An optical sensor in the form of a chip 4 is mounted on carrier substrate 2 with an adhesive layer 6 formed of epoxy or provided by an adhesive-coated tape in a lamination process as known in the art. Chip 4 is then electrically connected to carrier substrate 2 by wire bonds 8. Next, a protective barrier 10 is formed around the chip, such as by known transfer molding, pot molding, or injection molding processes, by photolithographic processes, by stereolithographic processes, or as otherwise known in the art. As shown in FIGS. 1A–1E, molded protective barrier 10 is in the shape of a wall surrounding a central exposed area containing chip 4 and its interconnections, including wire bonds 8. Once protective barrier 10 is formed, a transparent lid 12, having substantially the same size as the outer perimeter of the central exposed area, is lowered into the protective barrier 10. Transparent lid 12 is positioned at a distance from the chip 4 that provides optimal performance. For instance, if transparent lid 12 is shaped as a lens in order to possess certain desired optical characteristics, the transparent lid may be located at a specific focal point to ensure optimal image sensing. Positioning may be accomplished by contacting electrical probes 14 to the attachment pads 3 on the lower surface of the carrier substrate 2 to monitor for a desired sensor output while lowering transparent lid 12 within protective barrier 10. Alternatively, as shown in FIG. 3, if a set optimal distance for placement of transparent lid 12 from chip 4 is known, a ledge 16 may be formed on the inner perimeter 11 of protective barrier 10 to support transparent lid 12 at that distance. After transparent lid 12 has been located in the proper position, an adhesive coated on a perimeter 13 of transparent lid 12 or at an appropriate location of protective barrier 10 secures transparent lid 12 into place. The adhesive may comprise a pressure-sensitive adhesive or a so-called "activated adhesive." The term "activated adhesive" refers to materials that do not completely adhere or cure until acted upon by a specific initiating agency. Examples include UV curing, thermosetting or chemically activated epoxy. Chip 4, bond pads 5' thereof, and the intermediate conductive elements (e.g., wire bonds 8) that are secured to terminal pads 5, are effectively sealed in an area surrounded by protective barrier 10 and under transparent lid 12.

Protective barrier 10 is constructed of, for example, molding compound or a similar encapsulant material formed onto carrier substrate 2 using a transfer mold. As shown in FIGS. 2A–2E, under certain circumstances it may be desirable to form protective barrier 10 on carrier substrate 2 prior to mounting chip 4 to carrier substrate 2. This may reduce possible contamination or damage to chip 4 resulting from the process of forming protective barrier 10. Further, it would allow the formation of protective barrier 10 to be performed outside of a clean room environment which might otherwise be required if chip 4, which is highly sensitive to air-born contaminants, was already attached.

A second embodiment of the present invention is illustrated in FIGS. 4A–4F and 5. Image sensor chip 4 is mounted to carrier substrate 2 and connected by wire bonds 8 in the same manner as described above. A liquid epoxy 18 or other nonconductive adhesive material is then dispensed around the perimeter 7 of chip 4 to encapsulate wire bonds 8 and corresponding bond pads 5' on chip 4 and terminal pads 5 on carrier substrate 2. Transparent lid 12 is placed over chip 4, and contact of transparent lid 12 with liquid epoxy 18 that encapsulates the chip perimeter 7 provides an adhesive interface to retain transparent lid 12 in position over chip 4. The epoxy 18 is then cured to secure transparent lid 12 in place. Transparent lid 12 may be placed directly against the surface of chip 4, or a gasket 9 may be inserted between the two, if desired, to prevent liquid epoxy 18 from seeping into the area beneath transparent lid 12 due to capillary action. In the case where transparent lid 12 is formed as a lens, gasket 9 may also support transparent lid 12 at an optimal distance from chip 4, much like ledge 16 in FIG. 3 of the previously described embodiment.

Figure 5:
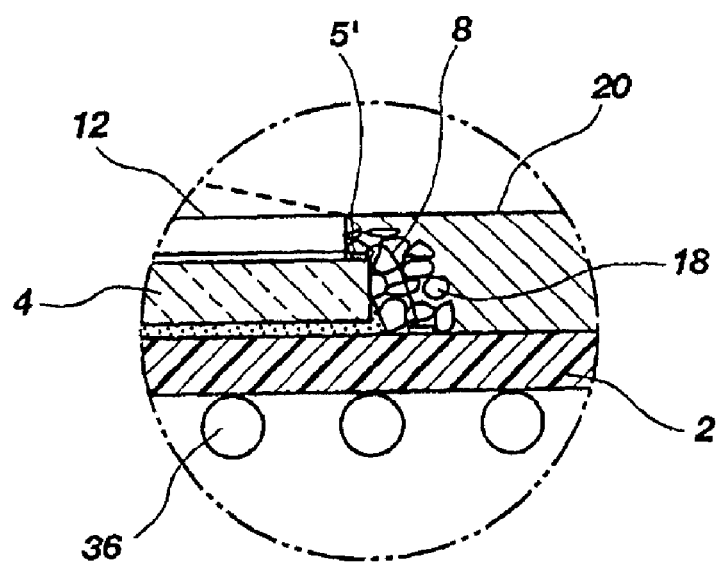
FIG. 5 is an enlarged schematic sectional view of the region II of FIG. 4F showing a layer of molding compound covering the epoxy and the perimeter area of the chip, and further retaining the edges of a transparent lid.
Figure 4A:
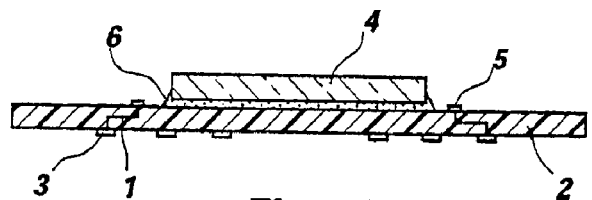
FIGS. 4A–4F are schematic sectional side views showing an exemplary method of forming an image sensor package, wherein encapsulation includes covering the perimeter area of a chip, including interconnections such as wire bonds and bond pads, with a liquid dispensed epoxy.
Figure 4B:
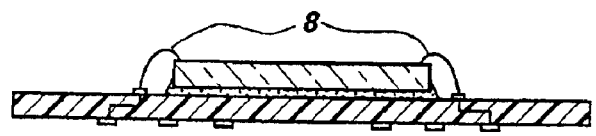
Figure 4C:
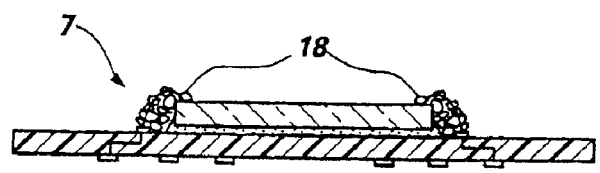
Figure 4D:
Figure 4E:
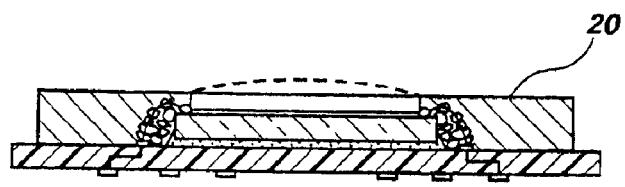
Figure 4F:
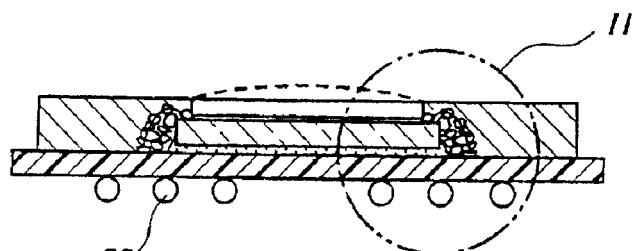
Figure 6A:
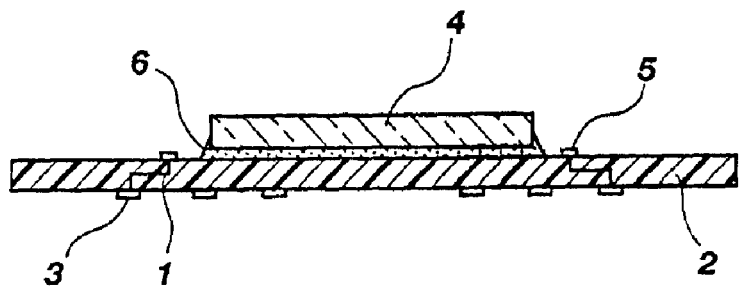
FIGS. 6A–6D are schematic sectional side views showing an exemplary method of forming an image sensor package, wherein encapsulation includes covering a chip with a unitary shell of entirely transparent material.
Figure 6B:
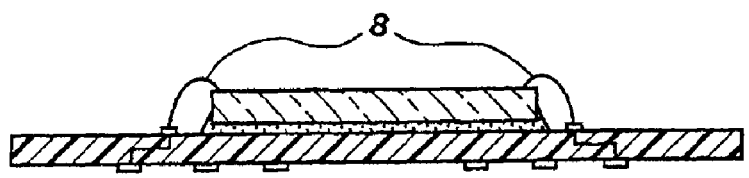
Figure 6C:
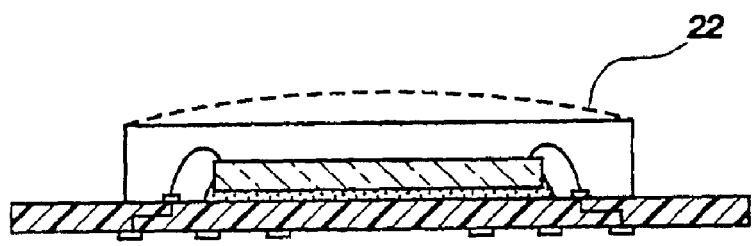
Figure 6D:
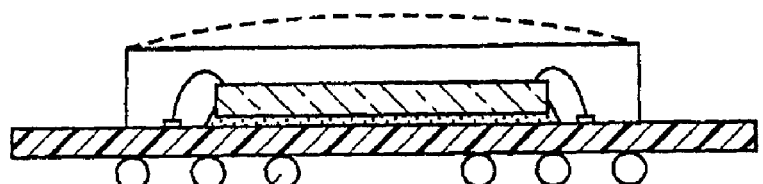

After attachment of transparent lid 12, the assembly is suitable for use as an image sensor package without any further encapsulation. In some cases, however, it may be desirable to reinforce the assembly with additional material in the form of molding compound. FIGS. 4E–4F show a layer 20 of molding compound applied to the assembly using a transfer molding process, although other known and suitable techniques (e.g., pot molding, injection molding, photolithography, stereolithography, etc.) may be used to form layer 20. As can be seen in FIG. 5, layer 20 covers epoxy 18 that encapsulates wire bonds 8 and the perimeter 7 of chip 4 and, further, retains the position of transparent lid 12 relative to chip 4.

FIGS. 6A–6D and 7 illustrate a third embodiment of the present invention. Chip 4 is mounted and connected to carrier substrate 2 as in the previously described embodiments. Next, a shell 22, formed entirely of a transparent material, may be added to the assembly for encapsulation of chip 4 and its associated interconnections, which, in the example of FIGS. 6A–6D, are wire bonds 8. The shell 22 may be formed by molding a transparent compound directly around chip 4 or, as in FIG. 7, attaching a preformed shell 22' to carrier substrate 2 with an adhesive.

In the case where shell 22 is formed directly around chip 4, a clear compound will be molded onto carrier substrate 2. Clear epoxy or other inexpensive resin-type materials, like polystyrene and silicon, may be used for the clear compound so long as they harden into a durable and highly transparent structure. Once formed, shell 22 acts both as a protective encapsulant for chip 4 and its interconnections and as a transparent lid for image sensing. An even, untextured surface improves the clearness or transmissivity of shell 22, which is important for optimal image sensing. This may be accomplished during the molding process by using a mold cavity made with one or more very smooth surfaces overlying the face of the chip 4. The mold cavity may also be used to determine optical qualities by imparting lens shapes or focusing surface features on the shell. Alternatively, the surface of shell 22 may be polished by known processes after molding to carrier substrate 2. The option of molding shell 22 directly around chip 4 offers the advantage of securing all the connections within a highly protective solid structure.

Figure 7:
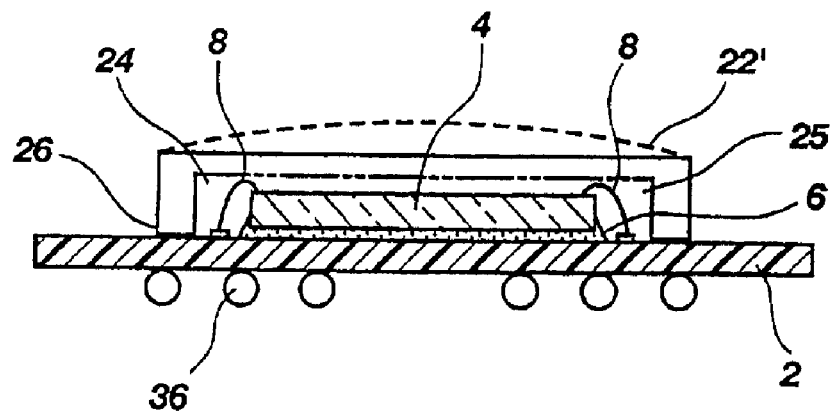
FIG. 7 is an alternative schematic sectional side view of the image sensor package formed by the method of FIGS. 6A–6D, wherein a preformed shell is used to cover the chip.

Turning to FIG. 7, when preformed shell 22' is used rather than molding a shell 22 directly around chip 4, the shell may be spaced apart from chip 4, forming a cavity 24 thereover, instead of comprising a solid structure on the surface of chip 4. An adhesive layer 26, such as epoxy or tape, may also be required for attachment at the interface between preformed shell 22' and carrier substrate 2. Enclosing chip 4 in this manner advantageously allows preformed shell 22' to later be removed if repair or replacement of parts in the image sensor package is necessary. If removal is not a concern, after preformed shell 22' is attached, cavity 24 may be filled in with a clear compound 25 like that used for molding so as to strengthen the package.

Another embodiment of the present invention is illustrated in FIGS. 8A through 10. After mounting and connecting chip 4 to carrier substrate 2, the assembly is loaded into a mold tooling 28. Transparent lid 12 is also loaded into mold tooling 28 so that transparent lid 12 and chip 4 are held into alignment and position for proper image sensing. The cavity (not shown) of mold tooling 28 is then filled with molding compound so as to create a layer 30 covering the area around the perimeter 7 of chip 4 and to retain transparent lid 12 while leaving its upper surface exposed. The encapsulation for the image sensor package is thereby completed. In order to prevent molding compound flash onto the top surface of transparent lid 12 during the molding process, a conformal film 32 may be applied between the interior surface of mold tooling 28 and transparent lid 12. This produces a gasketing effect and prevents molding compound intrusions.

Figure 10:
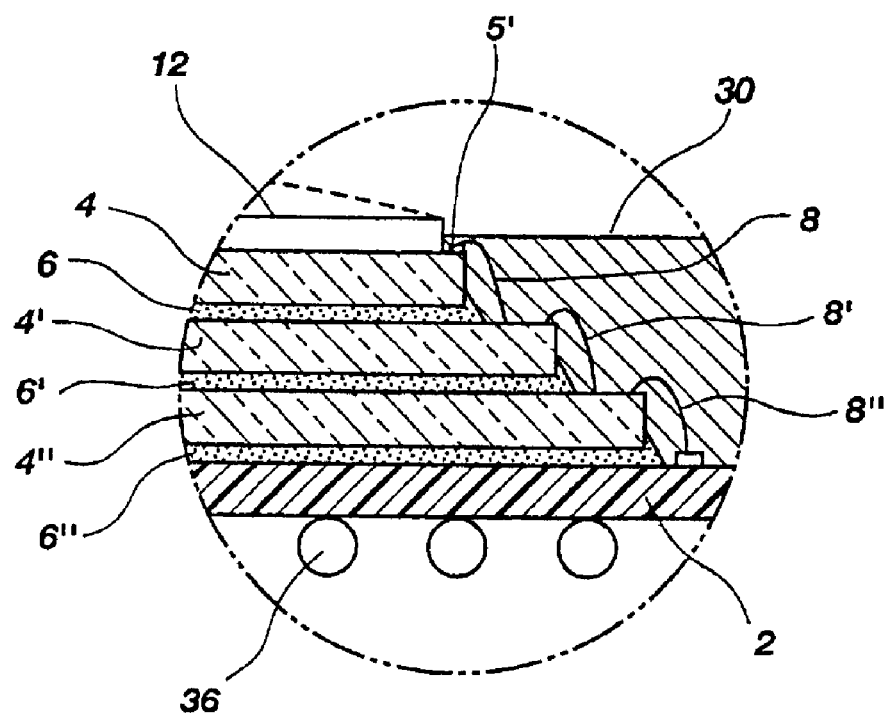
FIG. 10 is an enlarged schematic sectional view of the region IV of FIG. 9E showing a layer of molding compound covering the perimeter area of the chip stack, and further retaining the edges of the transparent lid.
Figure 8A:
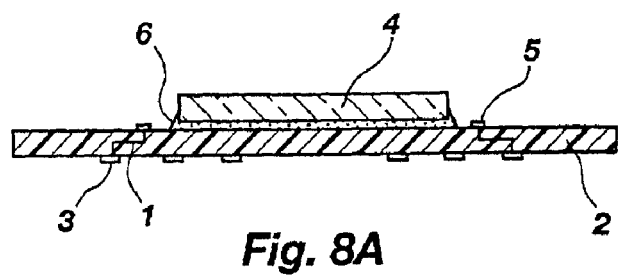
FIGS. 8A–8E are schematic sectional side views showing an exemplary method of forming an image sensor package, wherein encapsulation includes molding a chip and transparent lid together within a transfer mold.
Figure 8B:
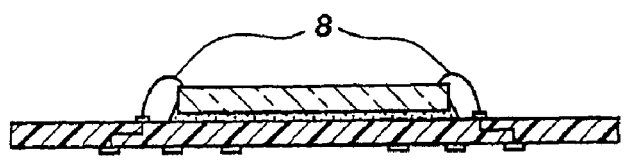
Figure 8C:
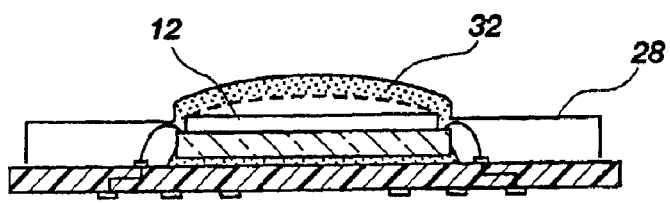
Figure 8D:
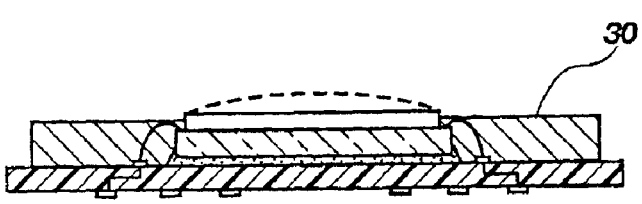
Figure 8E:
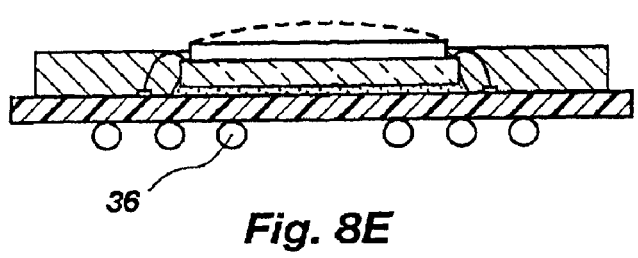
Figure 9A:
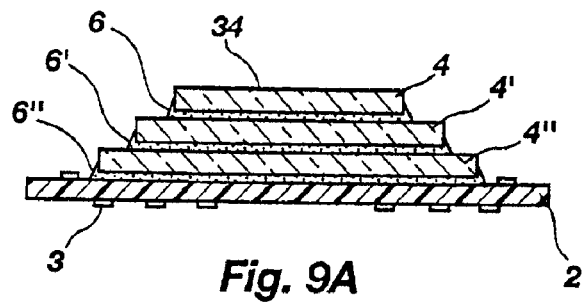
FIGS. 9A–9E are schematic sectional side views showing a method of forming an image sensor package as in FIGS. 8A–8E, wherein multiple electronic components in the form of a chip stack are encapsulated.
Figure 9B:
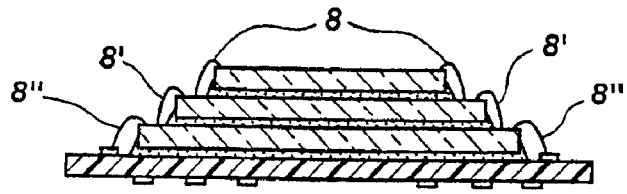
Figure 9C:
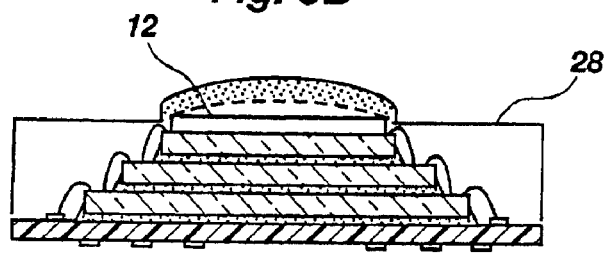
Figure 9D:
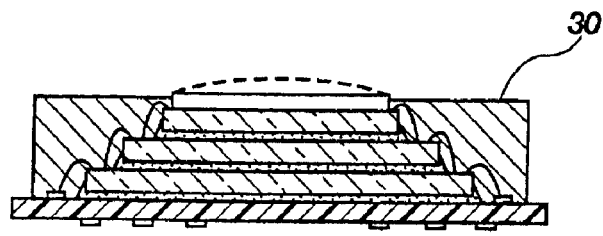
Figure 9E:
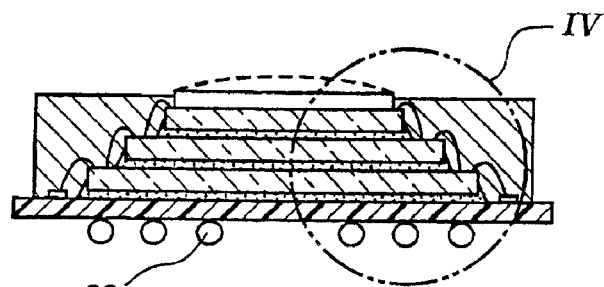

FIGS. 9A–9E shows a variation of the fourth embodiment of the present invention, wherein multiple electronic components 4, 4', 4" in the form of a multi-chip module 34 are enclosed within the package. Components 4, 4', 4" may be mounted to carrier substrate 2 and to each other with epoxy or adhesive-coated tape 6, 6', 6", and interconnected with wire bonds 8, 8', 8" or other suitable interconnections. Of course, multi-chip module 34 may be comprised of any number of components as long as the image sensor chip 4 is on top of the chip stack or in a position to be clear of obstruction. The encapsulation process then continues as previously described, with carrier substrate 2 and attached multi-chip module 34 being loaded into mold tooling 28 for alignment and molding with transparent lid 12. As can be seen in FIG. 10, layer 30 encapsulates the perimeter area and interconnections of multi-chip module 34, and retains transparent lid 12. Although an example of packaging multi-chip module 34 has been illustrated only in terms of the present transfer mold tooling embodiment, it should be clear that the first three encapsulating embodiments discussed above would also work well for enclosing a multi-chip module 34.

In all of the embodiments, after the encapsulation step the package may proceed through other conventional assembly steps. This includes attachment of solder balls 36, or other discrete conductive elements such as conductive or conductor-filled epoxy pillars, columns or bumps, on the bottom of carrier substrate 2 to form an easily mountable BGA package. Moreover, if the packaging has been assembled as an array of chips attached to one large substrate, it may be cut or otherwise divided into pieces that each comprise a single image sensor package.

It is also within the scope of the present invention that certain aspects of one of the described embodiments might be used in the fabrication of another of the described embodiments. The method of molding transparent shell 22 around image sensor chip 4 with clear compound, for instance, may be used for encapsulation in other embodiments. In the first embodiment, rather than using transparent lid 12 to cover the central exposed area of protective barrier 10, a clear compound may simply be filled into the central exposed area, with the upper surface of the clear compound being formed into the desired window or lens shape. Further, in the embodiments where transparent lid 12 is placed directly against the sensing surface of chip 4, the focal point for image sensing is constant and will be optimized based only on shaping when the form of a lens is required. In any of those embodiments, a transparent lid of clear compound directly molded onto chip 4 may be advantageous.

All of the above-illustrated embodiments of the present invention provide image sensor packages that are constructed of low cost material and require simple methods of assembly. The packages are also durable and lightweight, making them highly desirable for use in increasingly demanding operating conditions. Although the present invention has been depicted and described with respect to the illustrated embodiments, various additions, deletions and modifications are contemplated from its scope or essential characteristics. Furthermore, while described in the context of image sensor packaging, the invention has utility for packaging of all components that are sensitive to light or other radiation and require a transparent surface for exposure. The scope of the invention is, therefore, indicated by the appended claims rather than the foregoing description. All changes which come within the meaning and range of equivalency of the claims are to be embraced within their scope.

What is claimed is:

1. An electronic device package comprising:
    a carrier substrate having at least one conductive trace thereon, said at least one conductive trace having a first end and a second end;
    an electronic device sensitive to light or other radiation attached to a surface of said carrier substrate;
    at least one electrical interconnection between a bond pad on said electronic device and said first end of said at least one conductive trace;
    a layer of nonconductive material in contact with and encapsulating said first end of said at least one conductive trace, said at least one electrical interconnection and said bond pad; and
    a transparent lid covering a surface of said electronic device, said transparent lid having edges in adhesive contact with said layer of nonconductive material; and
    a layer of material adhered to said carrier substrate that contacts and encapsulates said layer of nonconductive material and said edges of said transparent lid.

2. The electronic device package according to claim 1, further comprising:
    a gasket forming a seal between said surface of said electronic device and said transparent lid.

3. The electronic device package according to claim 1, further comprising:
    a layer of material adhered to said carrier substrate that contacts and encapsulates said layer of nonconductive material and said edges of said transparent lid.

4. The electronic device package according to claim 1, wherein said electronic device comprises an image sensor.

5. The electronic device package according to claim 1, wherein said electronic device comprises a solid-state device selected from a group consisting of a charge coupled device, a complementary metal-oxide semiconductor and an erasable programmable read-only memory.

6. The electronic device package according to claim 5, wherein said electronic device further comprises a chip stack.

7. The electronic device package according to claim 1, wherein said carrier substrate is made of a material selected from a group consisting of plastic, FR-4 and BT.

8. The electronic device package according to claim 7, further comprising:
    at least one discrete conductive element attached to said second end of said at least one conductive trace of said carrier substrate.

* * * * *